United States Patent
Kho et al.

(10) Patent No.: US 9,558,114 B2
(45) Date of Patent: Jan. 31, 2017

(54) SYSTEM AND METHOD TO STORE DATA IN AN ADJUSTABLY PARTITIONABLE MEMORY ARRAY

(71) Applicant: Infineon Technologies AG, Neubiberg (DE)

(72) Inventors: Rex Kho, Holzkirchen (DE); Michael Hassel, Ottenhofen (DE); Wolfgang Beck, Munich (DE); Thomas Liebermann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 679 days.

(21) Appl. No.: 13/908,040

(22) Filed: Jun. 3, 2013

(65) Prior Publication Data

US 2014/0359249 A1 Dec. 4, 2014

(51) Int. Cl.
*G06F 12/06* (2006.01)
*G11C 8/12* (2006.01)
*G11C 16/24* (2006.01)

(52) U.S. Cl.
CPC ............ *G06F 12/0646* (2013.01); *G11C 8/12* (2013.01); *G11C 16/24* (2013.01); *G11C 2211/5641* (2013.01)

(58) Field of Classification Search
None
See application file for complete search history.

(56) References Cited

U.S. PATENT DOCUMENTS

| | | | | |
|---|---|---|---|---|
| 4,841,486 A | * | 6/1989 | Minato | G11C 11/419 365/189.09 |
| 5,537,352 A | * | 7/1996 | Meyer | G11C 7/1006 365/189.02 |
| 5,946,252 A | * | 8/1999 | Arimoto | G11C 7/10 365/189.18 |
| 6,091,632 A | * | 7/2000 | Yoshimi | G11C 16/3427 257/E27.103 |
| 2003/0198101 A1 | * | 10/2003 | Pio | G11C 8/08 365/200 |
| 2006/0203587 A1 | * | 9/2006 | Li | G11C 7/18 365/207 |
| 2007/0014179 A1 | * | 1/2007 | Hong | G11C 7/12 365/230.03 |
| 2007/0115724 A1 | * | 5/2007 | Hwang | G11C 16/0483 365/185.17 |
| 2008/0123423 A1 | * | 5/2008 | Kim | G11C 5/025 365/185.11 |
| 2010/0290286 A1 | * | 11/2010 | Koya | G11C 16/0483 365/185.08 |

* cited by examiner

Primary Examiner — Michael Krofcheck
(74) Attorney, Agent, or Firm — Eschweiler & Associates, LLC

(57) ABSTRACT

The disclosure relates to an electronic memory system, and more specifically, to a system for storing data in an adjustably partitionable memory array, and a method to store data in an adjustably partitionable memory array. According to an embodiment of the disclosure, a system to store data in an adjustably partitionable memory array is provided, the system including a plurality of memory cells arranged in an array of rows and columns, a plurality of bit lines, and a plurality of switches, wherein each bit line is electrically coupled to a column of memory cells and each bit line comprises a switch configured to allow the respective bit line to be partitioned by opening of the switch.

7 Claims, 7 Drawing Sheets

SYSTEM AND METHOD TO STORE DATA IN AN ADJUSTABLY PARTITIONABLE MEMORY ARRAY

FIELD

The disclosure generally relates to an electronic memory system, and more specifically, to a system for storing data in an adjustably partitionable memory array, and a method to store data in an adjustably partitionable memory array.

BACKGROUND

Modern microcontroller systems usually comprise several types of memory adapted to store different types of data. Conventionally, a microcontroller comprises a volatile memory (RAM) section and a non-volatile memory section, such as a ROM, EPROM, EEPROM, or Flash memory. The volatile memory section serves as the microcontroller's main memory and is used, among other things, to store programs that are being executed. The non-volatile memory section is used to store program data and operating parameter data.

The non-volatile memory systems of such microcontrollers are sometimes partitioned into two physically separate sections. Such microcontroller systems are employed, for example, in the automotive sector. The two physically separate sections of the non-volatile memory are then conveniently used to store two different types of data: program data and application data. Therefore, the first section of non-volatile memory may be provided to store program data and the second section of non-volatile memory may be provided to store application data. The program data is usually written to the memory just once and, after it has been written, is read from the memory many times. In contrast, the application data is written to and read from the memory repeatedly. Since the two sections of non-volatile memory are physically separate, the two sections can be accessed independently from each other. A first portion of data may, for example, be read from the first section, while, at the same time, a second portion of data is being written to the second section.

To make optimal use of this independent access to the two memory sections, one of the two sections should be used exclusively to store program data, whereas the other section should be used exclusively to store application data. Then, program data and application data can be accessed independently from each other. In many applications of microcontrollers in the automotive sector, however, this is not the case and program data is not cleanly separated from application data. Motor control tables, for example, are often stored in the memory section provided to store program data.

A problem arises when data which is stored in the memory section provided to store program data, such as the motor control tables mentioned above, needs to be accessed while a program is being executed by the microcontroller. Since the motor control tables are stored in the memory section that also contains the program data, i.e. the program code that is frequently accessed during execution of a program, accessing the motor control tables often requires interrupting a read access to the program code. This results in inefficient program execution and an overall loss of efficiency.

To solve the problem described above, usually one of the following two approaches is applied. Either the Flash memory is designed to allow access to the Flash memory to be interrupted very quickly. To achieve quick interrupts, the sense amplifiers provided in the Flash memory need to be in operation constantly, thus constantly drawing current. In addition, the circuitry needed to allow quick interrupts requires additional space. Or a second quick cache memory which is arranged between the Flash memory and the microprocessor of the microcontroller is enlarged. Cache memory typically consists of SRAMs which require a lot of space and draw a lot of current.

With the first approach the drawbacks of an interrupt are reduced but not eliminated. With the second approach the frequency of interrupts can be reduced. Factors influencing the frequency of interrupts are the program which is being executed, the cache hit rate, and the size of the cache. With the second approach there will still be interrupts, but these will occur less frequently.

For these or other reasons there is a need for an improved system and/or method to store data in an adjustably partitionable memory array.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated, as they become better understood by reference to the following detailed description.

FIG. 6 depicts a schematic representation of a method to store data in an adjustably partitionable memory array according to a further embodiment of the disclosure.

DETAILED DESCRIPTION

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

Figure 1:
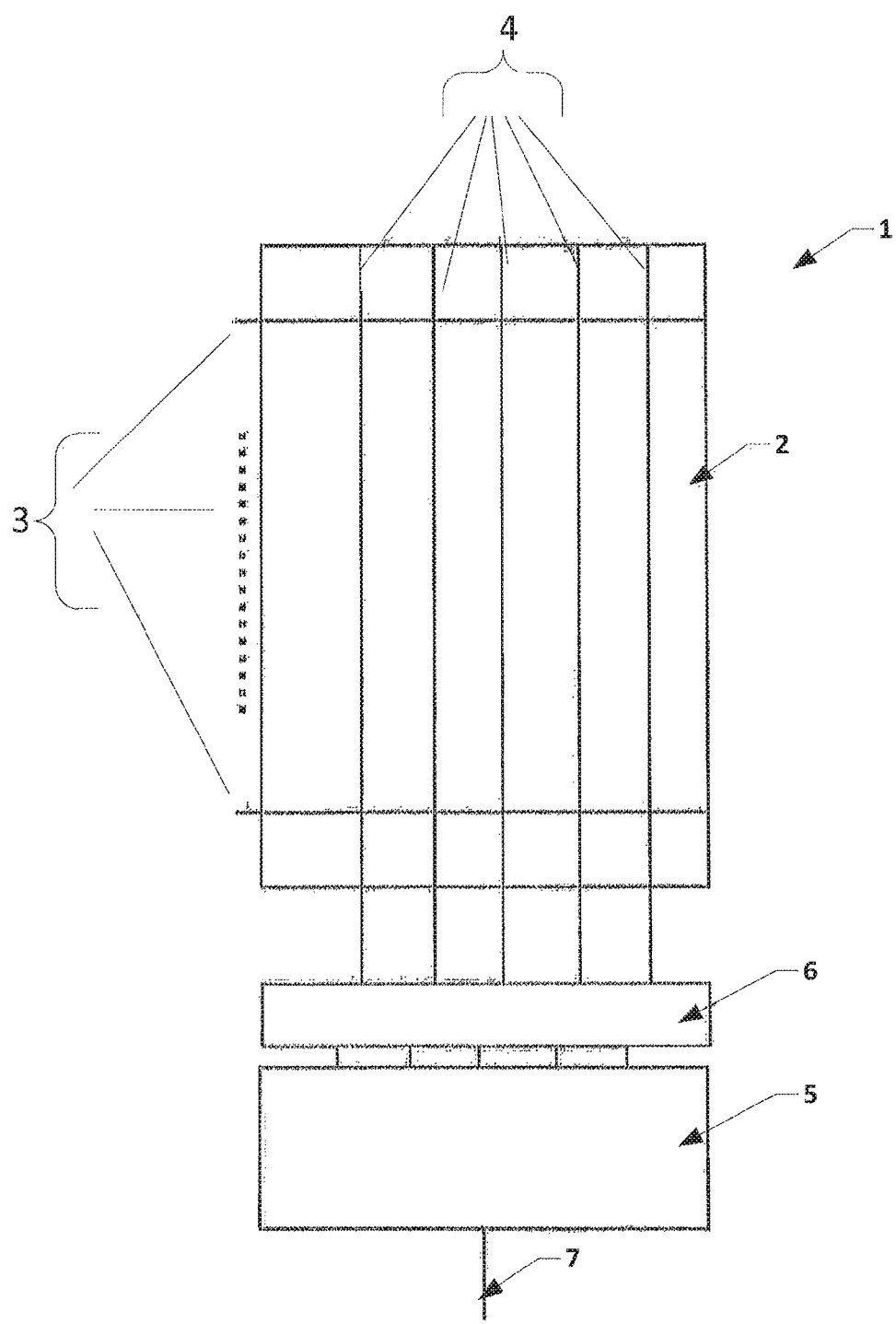
FIG. 1 depicts a schematic representation of a conventional memory device comprising a contiguous cell array which is accessed via bit lines and word lines.

FIG. 1 shows a conventional memory device 1 such as, for example, a Flash array. The memory device 1 comprises a contiguous cell array 2. This contiguous cell array 2 comprises a plurality of memory cells (not shown in FIG. 1) which are configured to store data. The memory cells are arranged in a regular array of rows and columns. The memory device 1 furthermore comprises a plurality of word lines 3 and a plurality of bit lines 4. Each word line 3 is coupled to a row of memory cells, whereas each bit line 4 is coupled to a column of memory cells. If, for example, the contiguous cell array 2 comprises n×m columns of memory cells, the memory device 1 will comprise n×m bit lines. Analogously, if the contiguous cell array 2 comprises p rows of memory cells, the memory device 1 will comprise p word lines. The contiguous cell array 2 comprising n×m columns of memory cells and p rows of memory cells will then comprise p×n×m memory cells altogether. The word lines 3 and the bit lines 4 are employed to access memory cells for reading, erasing, and programming. Generally, a memory cell is read, erased, or programmed by application of specific voltages to the word line 3 and to the bit line 4 coupled to the memory cell.

The memory device 1 furthermore comprises a plurality of sense amplifiers 5. The sense amplifiers 5 are used to sense the logic levels of the bit lines 4 by amplifying small voltage swings to recognizable logic levels. Therefore, the sense amplifiers 5 are instrumental for read-out of the memory cells.

The memory device 1 furthermore comprises a sense amplifier—bit line multiplexer (mux) block 6. This sense amplifier—bit line mux block 6 couples the sense amplifiers 5 to the bit lines 4 which are coupled to the columns of memory cells in the contiguous cell array 2. The sense amplifier—bit line mux block 6 is employed to reduce the number of sense amplifiers 5 needed to operate a specific number of columns of memory cells. If, as described above, the contiguous cell array 2 comprises n×m columns of memory cells, i.e. n×m bit lines 4, and a sense amplifier—bit line mux block 6 allowing 1:m muxing (short for multiplexing) is employed, n sense amplifiers 5 suffice to operate the n×m bit lines 4. Each of the n sense amplifiers 5 is coupled to a data line 7. Therefore, the memory device 1 comprises n data lines 7.

Typically, data is read from and written to the contiguous cell array 2 in data words. In the memory device 1 of FIG. 1 a data word comprises n bits. Therefore, typically n memory cells are accessed simultaneously. These n memory cells are generally coupled to a common word line. To access such a group of n memory cells of the contiguous cell array 2, a first voltage is applied to one of the p word lines 3, i.e. to the word line 3 coupled to the n memory cells which are to be accessed, and a second voltage is applied to n of the n×m bit lines 4, i.e. to the n bit lines 4 coupled to the n memory cells which are to be accessed. The sense amplifier—bit line mux block 6 then couples these n bit lines 4 to the n sense amplifiers 5. Finally, the n sense amplifiers 5 supply n signals to the n data lines 7. Therefore, in the memory device 1 shown in FIG. 1 and described above, all p×n×m memory cells of the contiguous cell array 2 can be accessed. To facilitate comprehension of the disclosure, in the following description reference is made to accessing single memory cells of a cell array. In practice, however, memory cells will generally not be accessed individually. Instead, data words will be read from and written to the cell array, i.e. n memory cells will be accessed simultaneously.

An example conventional memory device 1 with the capacity to store 1 Mbit of data may comprise a contiguous cell array 2 comprising 1048576 (=1024×1024) memory cells. The 1048576 memory cells may be arranged in a regular array comprising 512 rows, i.e. 512 word lines, and 2048 columns, i.e. 2048 bit lines. If a sense amplifier—bit line mux block allowing 1:64 muxing is employed, 32 sense amplifiers suffice to read out each of the 1048576 memory cells (32 bit data words). If the sense amplifier—bit line mux block allows 1:128 muxing, 16 sense amplifiers suffice (16 bit data words).

Figure 2A:
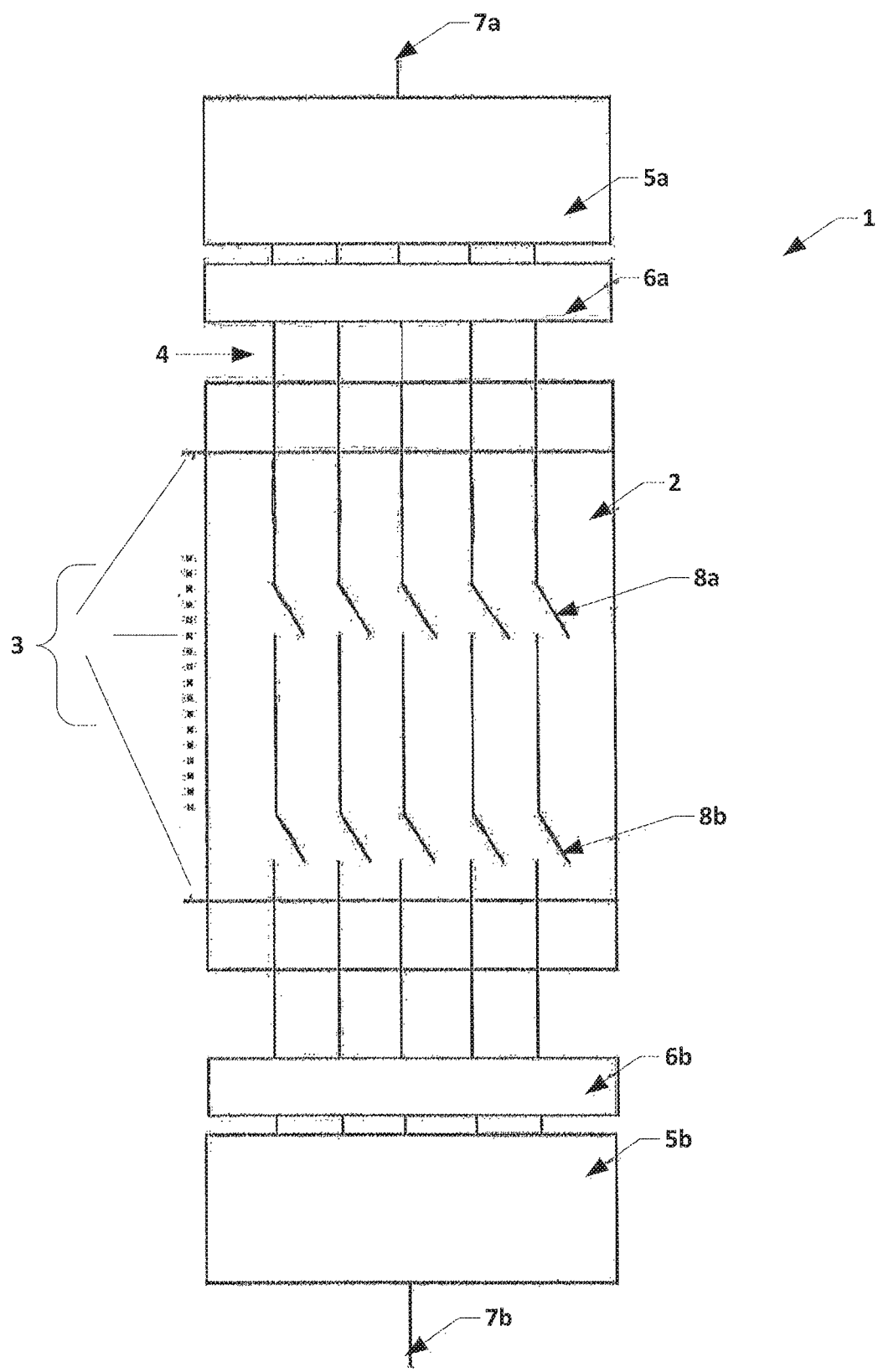
FIG. 2a depicts a schematic representation of a memory device according to an embodiment of the disclosure comprising a contiguous cell array which is configured to be flexibly partitionable into two sections that can be accessed independently from each other.

FIG. 2a shows a memory device 1 according to a first embodiment of the disclosure. In many aspects, this memory device 1 is similar to the memory device 1 of FIG. 1. In contrast to the memory device 1 of FIG. 1, however, the memory device 1 shown in FIG. 2a comprises two sets of sense amplifiers 5a and 5b, two sense amplifier—bit line mux blocks 6a and 6b, and two sets of data lines 7a and 7b. Furthermore, the bit lines 4 of the memory device 1 comprise a plurality of switches. These bit line switches are arranged in groups. In one embodiment FIG. 2a shows a first group of bit line switches 8a and a second group of bit line switches 8b. The bit line switches are configured to allow the bit lines to be selectively interrupted. In another embodiment of the disclosure, the memory device 1 comprises more than two groups of bit line switches. In one embodiment of the disclosure each group of bit line switches is arranged between two adjacent word lines, i.e. with a first word line positioned directly above the group of bit line switches and with a second word line positioned directly below the group of bit line switches. In another embodiment of the disclosure the groups of bit line switches are adapted to ensure that the bit line switches of each group of bit line switches are either collectively open or collectively closed, i.e. in this embodiment of the disclosure the bit line switches are not intended to be opened or closed individually, but always as a group. This restriction ensures that the bit lines of the memory device are always divided into sections of corresponding length.

The memory device 1 of FIG. 2a will now be described in more detail. In the memory device 1 of FIG. 2a, a first set of sense amplifiers 5a is arranged above the contiguous cell array 2 and a second set of sense amplifiers 5b is arranged below the contiguous cell array 2. A first sense amplifier—bit line mux block 6a is arranged between the first set of sense amplifiers 5a and the contiguous cell array 2 and a second sense amplifier—bit line mux block 6b is arranged between the second set of sense amplifiers 5b and the contiguous cell array 2. The first sense amplifier—bit line mux block 6a couples the bit lines 4 to the first set of sense amplifiers 5a, whereas the second sense amplifier—bit line mux block 6b couples the bit lines 4 to the second set of sense amplifiers 5b. The memory device 1 furthermore comprises a first set of data lines 7a coupled to the first set of sense amplifiers 5a and a second set of data lines 7b coupled to the second set of sense amplifiers 5b.

Furthermore, in the memory device 1 of FIG. 2a each bit line 4 comprises two switches, a first bit line switch 8a and a second bit line switch 8b. These bit line switches 8a and 8b are adapted to allow the bit lines 4 to be divided into sections. In particular, when the first bit line switch 8a is open while the second bit line switch 8b is closed, the bit line 4 is divided into a short upper section and into a long lower section. In contrast, when the first bit line switch 8a is closed while the second bit line switch 8b is open, the bit line 4 is divided into a long upper section and into a short lower section. Dividing the bit lines 4 into sections of adjustable length allows the contiguous cell array 2 to be partitioned into sections of adjustable size.

Figure 2B:
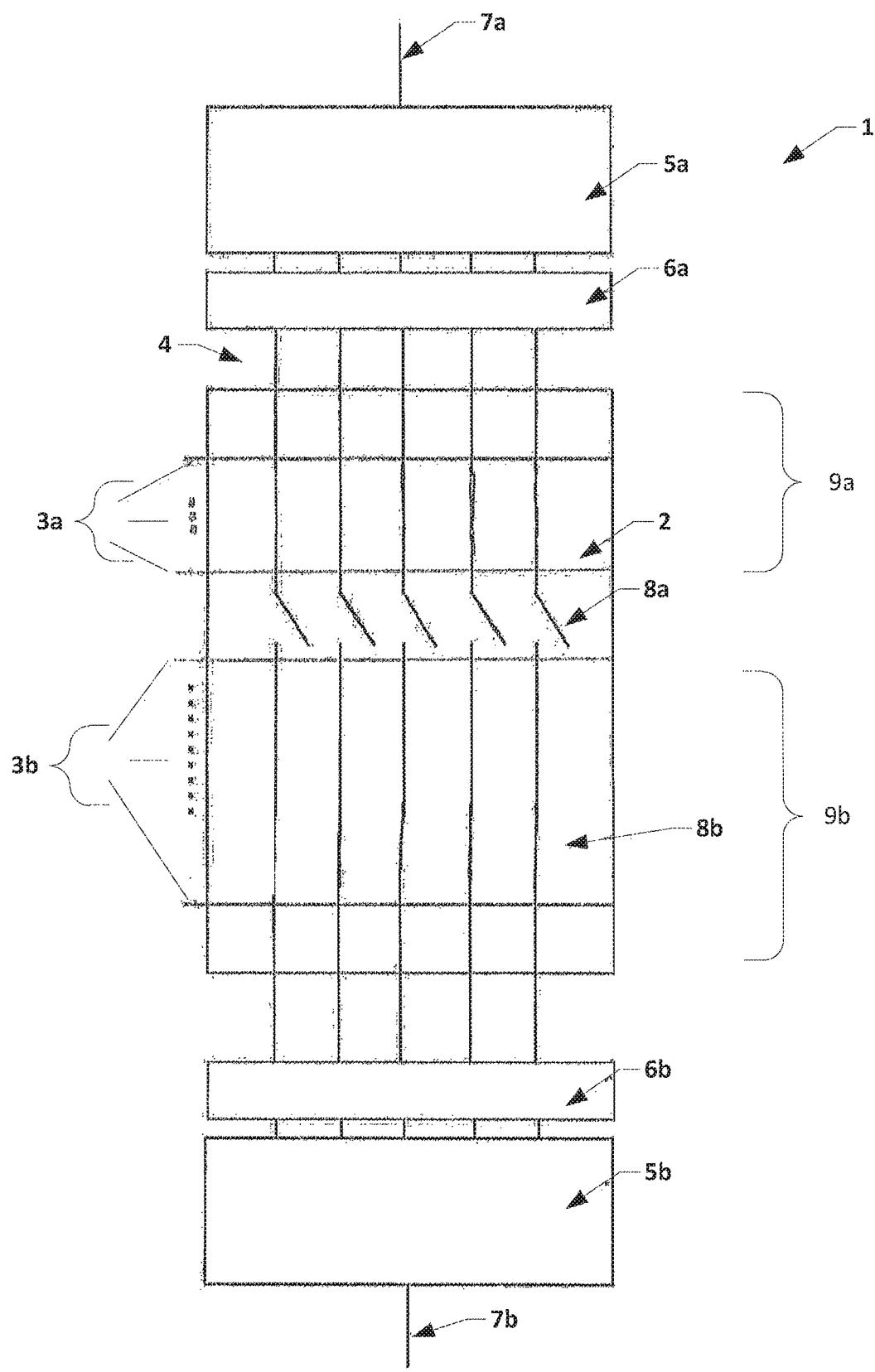
FIG. 2b depicts the memory device of FIG. 2a, wherein the contiguous cell array is partitioned into a first section and a second section with the first section being smaller than the second section.
Figure 2C:
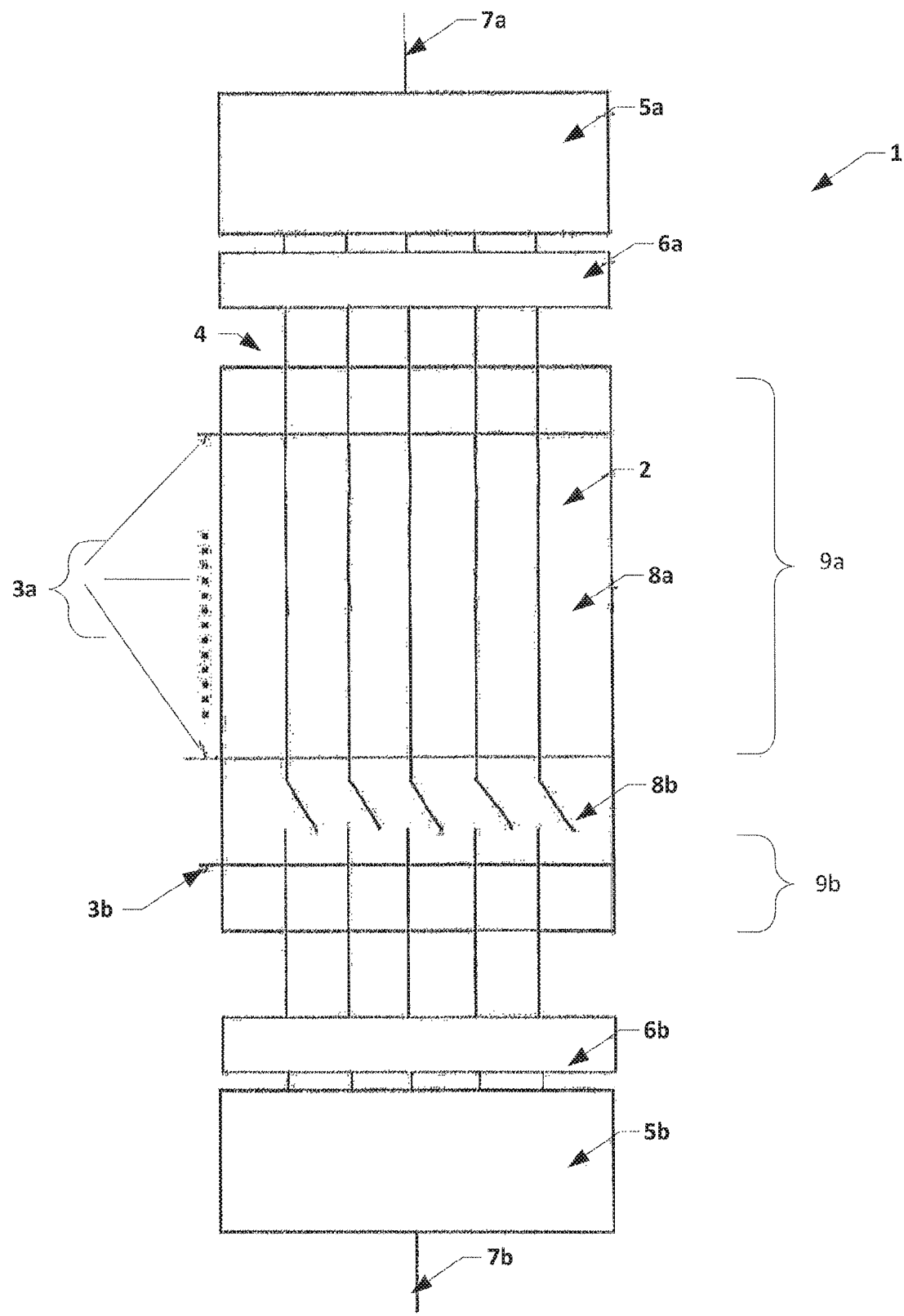
FIG. 2c depicts the memory device of FIG. 2a, wherein the contiguous cell array is partitioned into a first section and a second section with the first section being bigger than the second section.

The partitioning of the cell array 2 of the memory device 1 of FIG. 2a into sections of adjustable size will now be described in more detail with reference to FIGS. 2b and 2c. FIGS. 2b and 2c both show the memory device 1 of FIG. 2a. In FIG. 2b the first group of bit line switches 8a is open and the second group of bit line switches 8b is closed. This configuration of the bit line switches partitions the contiguous cell array 2 into a first section 9a and into a second section 9b. The first section 9a of the contiguous cell array 2 comprises all memory cells that are positioned above the first group of bit line switches 8a, whereas the second section 9b of the contiguous cell array 2 comprises all memory cells that are positioned below the first group of bit line switches 8a. As is clearly illustrated in FIG. 2b, the first section 9a of the contiguous cell array 2 is smaller than the second section 9b of the contiguous cell array 2. Opening the first group of bit line switches 8a and closing the second group of bit line switches 8b also partitions the word lines 3 into a first group of word lines 3a and into a second group of word lines 3b. The first group of word lines 3a comprises all word lines positioned above the first group of bit line switches 8a whereas the second group of word lines 3b comprises all word lines positioned below the first group of bit line switches 8a. Furthermore, the configuration of the bit line switches shown in FIG. 2b divides each bit line 4 into a short upper section and into a long lower section.

To access a specific memory cell in the first section 9a of the contiguous cell array 2, a first voltage is applied to one of the word lines of the first group of word lines 3a, i.e. to the word line connected to this specific memory cell. Furthermore, a second voltage is applied to the short upper section of one of the bit lines 4, i.e. to the short upper section of the bit line connected to the specific memory cell, via one of the sense amplifiers of the first group of sense amplifiers 5a and the first sense amplifier—bit line mux block 6a. Data read from or written to a memory cell in the first section 9a of the contiguous cell array 2 will be provided to one of the data lines in the first set of data lines 7a.

To access a specific memory cell in the second section 9b of the contiguous cell array 2, a first voltage is applied to one of the word lines of the second group of word lines 3b, i.e. to the word line connected to this specific memory cell. Furthermore, a second voltage is applied to the long lower section of one of the bit lines 4, i.e. to the long lower section of the bit line connected to the specific memory cell, via one of the sense amplifiers of the second group of sense amplifiers 5b and the second sense amplifier—bit line mux block 6b. Data read from or written to a memory cell in the second section 9b of the contiguous cell array 2 will be provided to one of the data lines in the second set of data lines 7b.

As a result, the two sections 9a and 9b of the contiguous cell array 2 can be accessed completely independently from each other. Therefore, with the memory device 1 of FIG. 2b it is possible, for example, to program a memory cell in the first section 9a of the contiguous cell array 2 while, at the same time, a memory cell in the second section 9b of the contiguous cell array 2 is being read.

FIG. 2c shows another configuration of the memory device 1. In the configuration of the memory device 1 shown in FIG. 2c the first group of bit line switches 8a is closed, whereas the second group of bit line switches 8b is open. This configuration of the bit line switches again partitions the contiguous cell array 2 into a first section 9a and into a second section 9b. The sizes of the first section 9a and the second section 9b, however, differ from the sizes of these sections in the configuration of the memory device 1 shown in FIG. 2b. Since the first section 9a of the contiguous cell array 2 again comprises all memory cells that are positioned above the first group of bit line switches 8a and the second section 9b of the contiguous cell array 2 comprises all memory cells that are positioned below the first group of bit line switches 8a, in the configuration of the memory device 1 shown in FIG. 2c the first section 9a is bigger than the second section 9b, i.e. the contiguous cell array 2 comprises a big first section 9a and a small second section 9b. As described in the context of FIG. 2b, the two sections of the contiguous cell array 2 can be accessed independently from each other.

In the memory device 1 of FIGS. 2a-2c each bit line 4 comprises two bit line switches. Therefore, the memory device 1 can adopt two distinct configurations: a first configuration with the first bit line switch of each bit line opened and the second bit line switch of each bit line closed (FIG. 2b), or a second configuration with the first bit line switch of each bit line closed and the second bit line switch of each bit line opened (FIG. 2c). These two configurations result in two different partitioning configurations of the contiguous cell array 2.

Consequently, the memory device 1 of FIGS. 2a-2c can be adjustably partitioned into two sections. Each of the two sections can be accessed independently from the other section. The size of the sections can be adjusted to the needs of the user of the memory device 1. If, for example, there is a need to store a small amount of data in the first section 9a of the memory device 1 and to store a large amount of data in the second section 9b of the memory device 1, the configuration of FIG. 2b will be chosen, i.e. the first group of bit line switches 8a will be opened and the second group of bit line switches 8b will be closed. If, on the other hand, there is a need to store a large amount of data in the first section 9a of the memory device 1 and to store a small amount of data in the second section 9b of the memory device 1, the configuration of FIG. 2c will be chosen, i.e. the first group of bit line switches 8a will be closed and the second group of bit line switches 8b will be opened.

In another embodiment of the disclosure, each bit line comprises more than two bit line switches. Such a memory device can adopt more than two distinct configurations. Generally, in each configuration one of the bit line switches of each bit line is open and the rest of the bit line switches is closed. Therefore, each configuration may be characterized by the position of the open bit line switch, i.e. in the first configuration the first bit line switch of a bit line is open, in the second configuration the second bit line switch of a bit line is open, and so on. By integrating more than two bit line switches into each bit line, the adaptability of the partitioning of the memory device into sections can be enhanced.

In another embodiment of the disclosure, the bit line switches are configured to be individually selectable. Then, in one embodiment, the bit line switches are not operated in groups, but individually. In the memory device 1 of FIG. 2a, for example, some of the bit line switches of the first group of bit line switches 8a may be open and the rest of the bit line switches of the first group of bit line switches 8a may be closed. Similarly, in the second group of bit line switches 8b some bit line switches may be open and others closed. In an example configuration of the memory device 1 of FIG. 2a the first (leftmost) three bit line switches of the first group of bit line switches 8a are closed, whereas the last (rightmost) two bit line switches of the first group of bit line switches 8a are open. Furthermore, in this example configuration of the memory device 1 the first (leftmost) three bit line switches of the second group of bit line switches 8b are open, whereas the last (rightmost) two bit line switches of the second group of bit line switches 8b are closed.

This configuration of the bit line switches partitions the contiguous cell array 2 into three sections: a first section which comprises all memory cells that are positioned above the first group of bit line switches 8a; a second section which comprises all memory cells that are positioned below the second group of bit line switches 8b; and a third section which comprises all memory cells that are positioned below the first group of bit line switches 8a and above the second group of bit line switches 8b. The first section and the second section can be accessed simultaneously and independently from each other as described above in the context of FIGS. 2b and 2c, i.e. the first section is accessed through the first set of data lines 7a (n data lines), whereas the second section is accessed through the second set of data lines 7b (n data lines). Therefore, a total of 2×n data lines can be simultaneously accessed. The third section, however, cannot be accessed concurrently with the first or second section. Instead, if a word line of the third section is activated, i.e. a word line positioned below the first group of bit line switches 8a and above the second group of bit line switches 8b, the first (leftmost) three bit lines are accessed through the first set of data lines 7a, whereas the last (rightmost) two bit lines are accessed through the second set of data lines 7b. As a result, a total of only n data lines would be accessed in this case.

Figure 3:
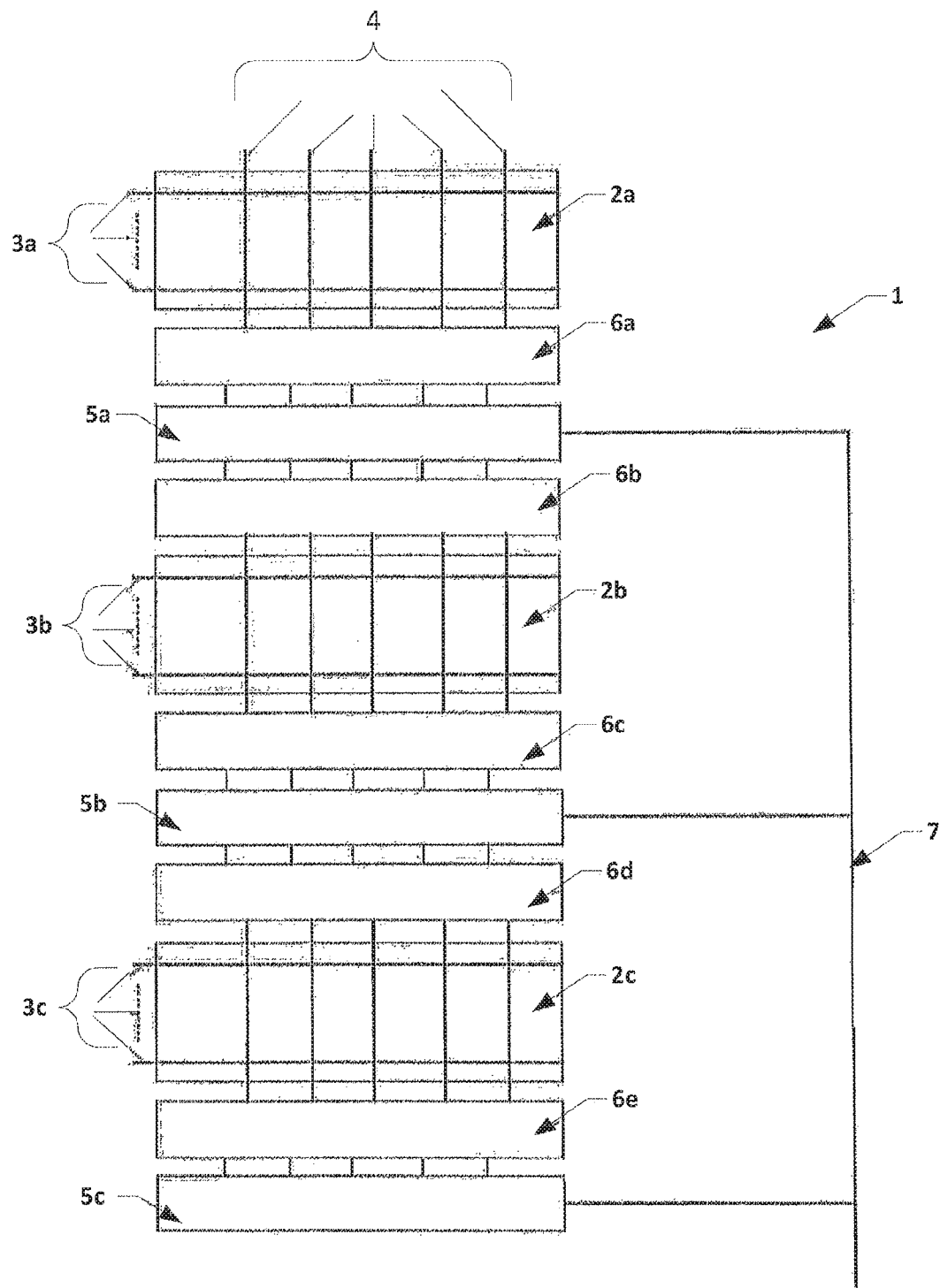
FIG. 3 depicts a schematic representation of a conventional memory device comprising three separate sections of contiguous cell arrays which are coupled to a common data line.

FIG. 3 shows another conventional memory device 1. This conventional memory device 1 comprises three separate sections of contiguous cell arrays: a first contiguous cell array 2a, a second contiguous cell array 2b, and a third contiguous cell array 2c. The memory device 1 furthermore comprises three groups of sense amplifiers: a first group of sense amplifiers 5a, a second group of sense amplifiers 5b, and a third group of sense amplifiers 5c. These three groups of sense amplifiers 5a-5c are coupled to a common set of data lines 7. Furthermore, the memory device 1 comprises five sense amplifier—bit line mux blocks 6a-6e. A first sense amplifier—bit line mux block 6a is positioned between the first contiguous cell array 2a and the first group of sense amplifiers 5a. A second sense amplifier—bit line mux block 6b is positioned between the first group of sense amplifiers 5a and the second contiguous cell array 2b. A third sense amplifier—bit line mux block 6c is positioned between the second contiguous cell array 2b and the second group of sense amplifiers 5b. A fourth sense amplifier—bit line mux block 6d is positioned between the second group of sense amplifiers 5b and the third contiguous cell array 2c. A fifth sense amplifier—bit line mux block 6e is positioned between the third contiguous cell array 2c and the third group of sense amplifiers 5c. Another sense amplifier—bit line mux block coupled to an additional group of sense amplifiers (not shown in FIG. 3) may be added on top of the first contiguous cell array 2a. The additional group of sense amplifiers is then also connected to the common set of data lines 7.

Each of the three contiguous cell arrays 2a-2c comprises a plurality of memory cells (not shown in FIG. 3) which are arranged in a regular array of columns and rows. The memory device 1 comprises three groups of word lines: a first group of word lines 3a, a second group of word lines 3b, and a third group of word lines 3c. The word lines of the first group of word lines 3a are coupled to the rows of memory cells of the first contiguous cell array 2a, the word lines of the second group of word lines 3b are coupled to the rows of memory cells of the second contiguous cell array 2b, and the word lines of the third group of word lines 3c are coupled to the rows of memory cells of the third contiguous cell array 2c. The memory device 1 furthermore comprises a plurality of bit lines 4. These bit lines 4 are coupled to the columns of memory cells of the first, second, and third contiguous cell array 2a-2c. The word lines 3a-3c and the bit lines 4 are used to access the memory cells of the memory device 1 as described in the context of FIG. 1. Data read from the contiguous cell arrays 2a-2c is supplied to the common set of data lines 7 via the sense amplifier—bit line mux blocks 6a-6e and the groups of sense amplifiers 5a-5c. By making use of several separate sections of contiguous cell arrays, as in the memory device 1 of FIG. 3, the bit lines 4 required to access the memory cells of the memory device 1 can be kept short. In comparison to the memory device 1 of FIG. 1, this improves the access time to the memory cells. Therefore, sectioning the memory device 1 as shown in FIG. 3 is particularly advantageous for large memory devices.

Figure 4:
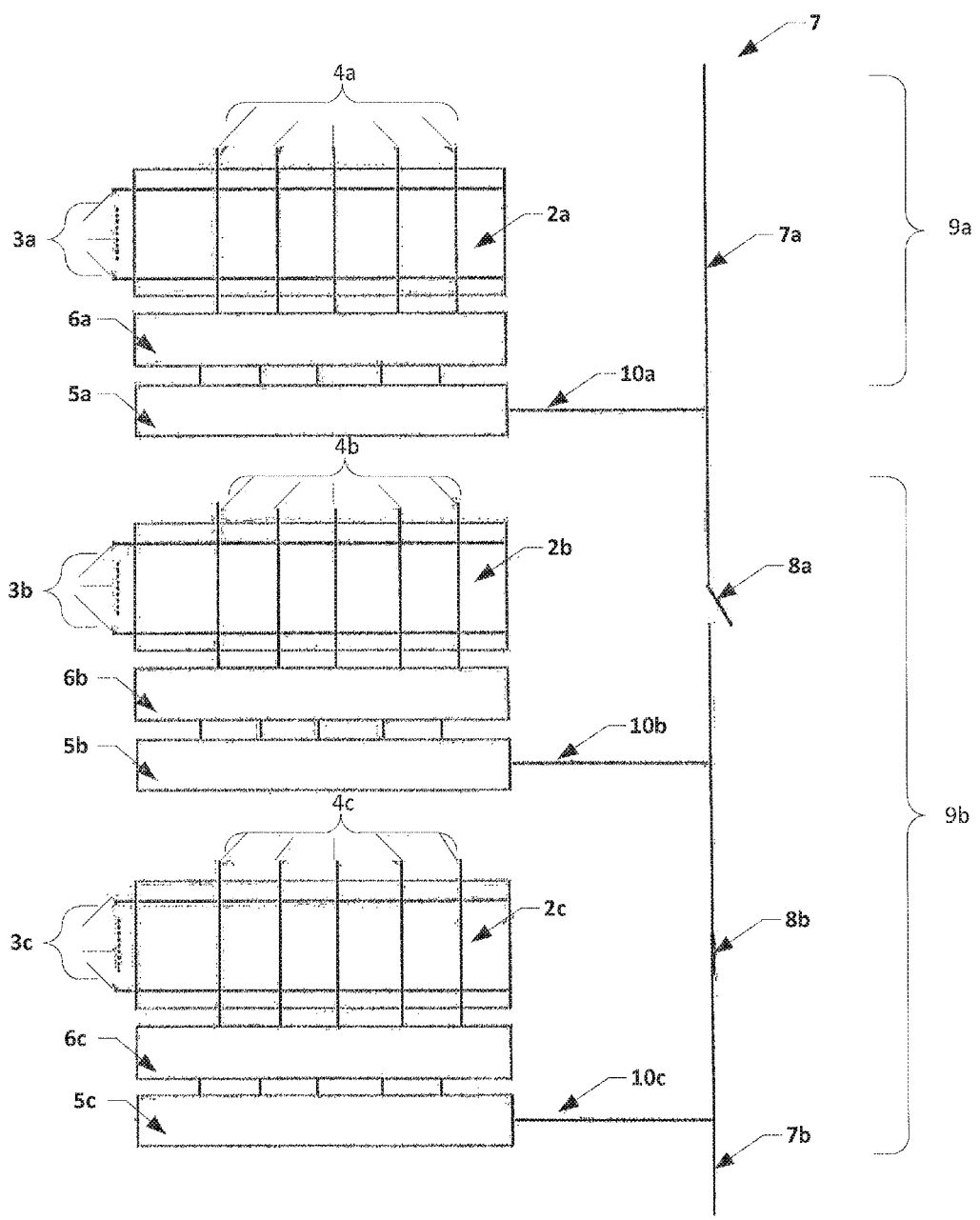
FIG. 4 depicts a schematic representation of a memory device according to an embodiment of the disclosure comprising three separate sections of contiguous cell arrays which are coupled to a common data line which is partitionable into sections.

FIG. 4 shows a memory device 1 according to another embodiment of the disclosure. In many aspects this memory device 1 is similar to the conventional memory device 1 of FIG. 3. The memory device 1 of FIG. 4 again comprises three separate sections of contiguous cell arrays: a first contiguous cell array 2a, a second contiguous cell array 2b, and a third contiguous cell array 2c. Each of these contiguous cell arrays 2a-2c comprises a plurality of memory cells arranged in a regular array of rows and columns. The memory device 1 furthermore comprises three groups of word lines 3a-3c and three groups of bit lines 4a-4c. A first group of word lines 3a is coupled to the rows of memory cells of the first contiguous cell array 2a and a first group of bit lines 4a is coupled to the columns of memory cells of the first contiguous cell array 2a. A second group of word lines 3b is coupled to the rows of memory cells of the second contiguous cell array 2b and a second group of bit lines 4b is coupled to the columns of memory cells of the second contiguous cell array 2b. A third group of word lines 3c is coupled to the rows of memory cells of the third contiguous cell array 2c and a third group of bit lines 4c is coupled to the columns of memory cells of the third contiguous cell array 2c.

The memory device 1 furthermore comprises three groups of sense amplifiers 5a-5c and three sense amplifier—bit line mux blocks 6a-6c. The first sense amplifier—bit line mux block 6a couples the first group of bit lines 4a to the first group of sense amplifiers 5a. The second sense amplifier—bit line mux block 6b couples the second group of bit lines 4b to the second group of sense amplifiers 5b. The third sense amplifier—bit line mux block 6c couples the third group of bit lines 4c to the third group of sense amplifiers 5c. All three groups of sense amplifiers 5a-5c are connected to a common set of data lines 7 via sets of link lines 10a, 10b, and 10c.

The memory device 1 furthermore comprises two data line switches 8a and 8b. These data line switches 8a and 8b are integrated into the common set of data lines 7. The first data line switch 8a is positioned between the first set of link lines 10a and the second set of link lines 10b, whereas the second data line switch 8b is positioned between the second set of link lines 10b and the third set of link lines 10c. The data line switches 8a and 8b are configured to partition the set of data lines 7 into a first section 7a and into a second section 7b. In the configuration shown in FIG. 4 the first data line switch 8a is open whereas the second data line switch 8b is closed. This configuration partitions the set of data lines 7 into a short upper section 7a and into a long lower section 7b. The first contiguous cell array 2a is coupled to the short upper section 7a, whereas the second contiguous cell array 2b and the third contiguous cell array 2c are coupled to the long lower section 7b. Therefore, data read from the first contiguous cell array 2a is supplied to the short upper section 7a of the set of data lines 7, whereas data read from the second contiguous cell array 2b or from the third contiguous cell array 2c is supplied to the long lower section 7b of the set of data lines 7. As a result, in the configuration shown in FIG. 4, the memory device 1 is partitioned into a first section 9a and into a second section 9b. The first section 9a comprises the first contiguous cell array 2a, whereas the second section 9b comprises the second contiguous cell array 2b and the third contiguous cell array 2c. Both sections 9a and 9b can be accessed independently from each other.

The sizes of the first section 9a and the second section 9b can be easily changed by closing the first data line switch 8a and opening the second data line switch 8b. Then the set of data lines 7 is partitioned into a long upper section 7a and into a short lower section 7b. In this configuration of the memory device 1 the first contiguous cell array 2a as well as the second contiguous cell array 2b are coupled to the long upper section 7a, whereas the third contiguous cell array 2c is coupled to the short lower section 7b.

According to another embodiment of the disclosure the memory device comprises more than three separate sections of contiguous cell arrays. Advantageously, the memory device will then comprise more than two data line switches. Generally, in an embodiment of the disclosure with a memory device comprising n separate sections of contiguous cell arrays, the memory device will preferably comprise n−1 data line switches. In one embodiment, each of the n−1 data line switches is positioned between two adjacent sections of contiguous cell arrays.

According to another embodiment of the disclosure, the contiguous cell arrays of the memory device are arranged on a common well. According to one embodiment of the disclosure, the contiguous cell arrays are arranged on separate wells, i.e. each contiguous cell array has its own well. If each contiguous cell array has its own well, disturbances of the memory cells of a first contiguous cell array experienced while a memory cell of a second contiguous cell array is being accessed can be minimized. According to a further embodiment of the disclosure, the memory array is a non-volatile memory array. According to one embodiment of the disclosure, the memory array is a Flash memory array.

Figure 5:
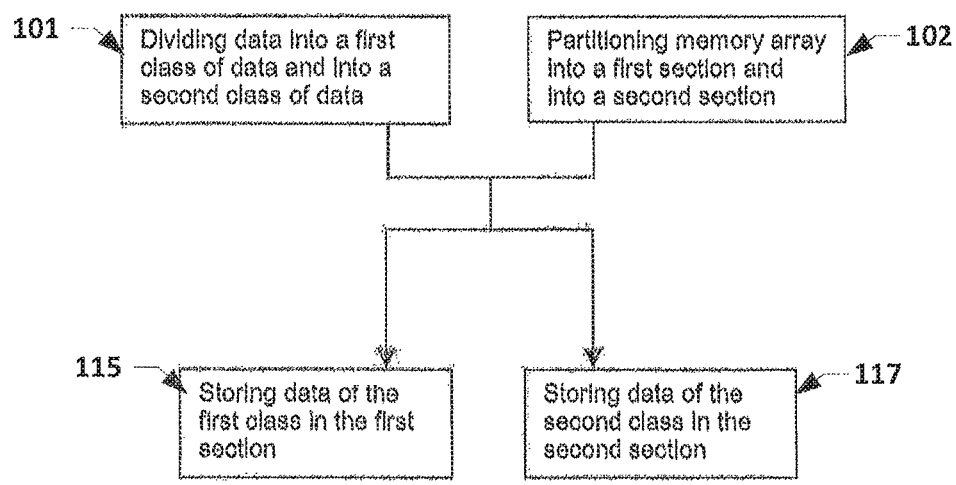
FIG. 5 depicts a schematic representation of a method to store data in an adjustably partitionable memory array according to an embodiment of the disclosure.

FIG. 5 shows a schematic representation of a method to store data in an adjustably partitionable memory array according to an embodiment of the disclosure. The method comprises dividing data into a first class of data and into a second class of data at 101, and partitioning the memory array into a first section and into a second section at 102. The method further comprises storing data of the first class in the first section at 115, and storing data of the second class in the second section at 117.

FIG. 6 shows a schematic representation of a method to store data in an adjustably partitionable memory array according to a further embodiment of the disclosure. The method comprises dividing data into a first class of data and into a second class of data at 201, determining the amount of data of the first class at 203, and determining the amount of data of the second class at 205. The method further comprises choosing a first size based on the amount of data of the first class at 207, choosing a second size based on the amount of data of the second class at 209, and partitioning the memory array into a first section having the first size at 211. Lastly, the method comprises partitioning the memory array into a second section having the second size at 213, storing data of the first class in the first section at 215, and storing data of the second class in the second section at 217.

By choosing the size of the first section of the memory array based on the amount of data of the first class and by choosing the size of the second section of the memory array based on the amount of data of the second class, the partitioning of the memory array can be optimally adjusted to specific requirements. As a result, a memory array is obtained which comprises two optimally sized sections.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A system to store data in an adjustably partitionable memory array, the system comprising:
   a plurality of memory cells arranged in an array of rows and columns,
   a plurality of bit lines, and
   a plurality of switches,
   wherein each bit line is electrically coupled to a column of memory cells,
   wherein each bit line comprises at least two switches configured to allow the respective bit line to be partitioned by opening of the switches;
   wherein the switches are grouped into groups of switches in such a way that each group of switches is located between two adjacent rows of memory cells;
   wherein each group of switches is configured to be transferable between a first configuration and a second configuration, wherein in the first configuration all switches of a respective group of switches are closed and in the second configuration all switches of the respective group of switches are open; and
   wherein the system is configured to ensure that only one group of switches at a time adopts the second configuration.

2. The system of claim 1, further comprising a first group of sense amplifiers and a second group of sense amplifiers, wherein the first group of sense amplifiers is arranged above the plurality of memory cells and the second group of sense amplifiers is arranged below the plurality of memory cells.

3. A system to store data in an adjustably partitionable memory array, the system comprising:
   a plurality of contiguous cell arrays, and
   a set of data lines,
   wherein each contiguous cell array is coupled to the set of data lines, and
   wherein the set of data lines comprises at least two data line switches configured to allow the set of data lines to be partitioned by opening of the data line switches, wherein only one data line switch is opened at a time.

4. The system of claim 3, further comprising:
   a plurality of groups of sense amplifiers, and
   a plurality of sets of link lines, wherein at least one group of sense amplifiers is associated with each contiguous cell array,
wherein each group of sense amplifiers is connected to the set of data lines by a set of link lines, and
wherein each data line switch is located between two adjacent sets of link lines.

5. The system of claim 3, wherein the contiguous cell arrays are arranged on separate wells.

6. A method of partitioning a memory array into a first section and into a second section, the method comprising opening a switch;
wherein the memory array comprises a set of data lines comprising at least two data line switches and wherein opening a switch comprises opening a data line switch, wherein only one data line switch is opened at a time.

7. A method of partitioning a memory array comprising a plurality of memory cells into a first section and into a second section, the method comprising opening a switch, wherein the memory array further comprises a plurality of bit lines, each bit line comprising at least two bit line switches, wherein each bit line is electrically coupled to a column of memory cells, and wherein opening a switch comprises opening a bit line switch; and
wherein the bit line switches are grouped into groups of bit line switches in such a way that each group of the bit line switches is located between two adjacent rows of memory cells, wherein each group of bit line switches is configured to be transferable between a first configuration and a second configuration, wherein in the first configuration all bit line switches of a respective group of bit line switches are closed and in the second configuration all bit line switches of the respective group of bit line switches are open and wherein only one group of bit line switches at a time adopts the second configuration.

* * * * *